United States Patent
Jang

(10) Patent No.: US 11,968,816 B2
(45) Date of Patent: Apr. 23, 2024

(54) MAGNETIC FIELD SHIELDING SHEET

(71) Applicant: AMOSENSE CO., LTD., Cheonan-si (KR)

(72) Inventor: Kil Jae Jang, Cheonan-si (KR)

(73) Assignee: AMOSENSE CO., LTD., Cheonan-si (KR)

( * ) Notice: Subject to any disclaimer, the term of this patent is extended or adjusted under 35 U.S.C. 154(b) by 190 days.

(21) Appl. No.: 17/628,781

(22) PCT Filed: Jul. 22, 2020

(86) PCT No.: PCT/KR2020/009650
§ 371 (c)(1),
(2) Date: Jan. 20, 2022

(87) PCT Pub. No.: WO2021/015550
PCT Pub. Date: Jan. 28, 2021

(65) Prior Publication Data
US 2022/0279686 A1    Sep. 1, 2022

(30) Foreign Application Priority Data

Jul. 22, 2019 (KR) .................. 10-2019-0088416
Jul. 22, 2020 (KR) .................. 10-2020-0090939

(51) Int. Cl.
*H05K 9/00* (2006.01)
*B32B 3/26* (2006.01)
(Continued)

(52) U.S. Cl.
CPC .......... *H05K 9/0075* (2013.01); *B32B 3/266* (2013.01); *B32B 7/12* (2013.01); *B32B 15/043* (2013.01);
(Continued)

(58) Field of Classification Search
CPC ........ H05K 9/0075; H02J 50/20; H02J 50/70; B32B 3/266; B32B 7/12; B32B 15/043;
(Continued)

(56) References Cited

U.S. PATENT DOCUMENTS

2016/0345473 A1    11/2016    Lee et al.
2018/0132376 A1*    5/2018    Shin .................. H05K 7/20
(Continued)

FOREIGN PATENT DOCUMENTS

KR    10-2016-0028384 A    3/2016
KR    10-2016-0118911 A    10/2016
(Continued)

OTHER PUBLICATIONS

International Search Report issued in PCT/KR2020/009650 dated Nov. 2, 2020, 3 pages.

*Primary Examiner* — Carlos Amaya
(74) *Attorney, Agent, or Firm* — ROTHWELL, FIGG, ERNST & MANBECK, P.C.

(57) ABSTRACT

A magnetic field shielding sheet according to one embodiment is a magnetic field shielding sheet for an antenna that includes a hollow portion formed in a central region and having a predetermined area and a pattern portion surrounding the hollow portion. The magnetic field shielding sheet includes a sheet body formed as a multi-layer sheet in which a plurality of sheets are stacked in multiple layers with adhesive layers therebetween, wherein the sheet body is a multi-layer sheet in which the plurality of sheets having a relatively lower magnetic permeability while having a relatively higher surface resistance along a stacking direction are sequentially stacked.

15 Claims, 11 Drawing Sheets

(51) Int. Cl.
  *B32B 7/12*   (2006.01)
  *B32B 15/04*  (2006.01)
  *H02J 50/20*  (2016.01)
  *H02J 50/70*  (2016.01)

(52) U.S. Cl.
  CPC .............. *H02J 50/20* (2016.02); *H02J 50/70* (2016.02); *B32B 2307/212* (2013.01); *B32B 2307/732* (2013.01); *B32B 2457/00* (2013.01)

(58) Field of Classification Search
  CPC ........ B32B 2307/212; B32B 2307/732; B32B 2457/00
  See application file for complete search history.

(56) References Cited

U.S. PATENT DOCUMENTS

| | | | |
|---|---|---|---|
| 2018/0137971 A1 | 5/2018 | Jang | |
| 2018/0198305 A1* | 7/2018 | Hwang | ................ H05K 9/0075 |
| 2019/0044391 A1* | 2/2019 | Jang | .................... H04B 5/0081 |
| 2019/0148988 A1* | 5/2019 | Hwang | ................. H02J 50/70 |
| | | | 307/104 |

FOREIGN PATENT DOCUMENTS

| | | |
|---|---|---|
| KR | 10-2016-0138909 A | 12/2016 |
| KR | 10-2017-0129521 A | 11/2017 |
| KR | 10-1646169 B1 | 8/2018 |
| KR | 10-2018-0102528 A | 9/2018 |

* cited by examiner

MAGNETIC FIELD SHIELDING SHEET

CROSS REFERENCE TO RELATED APPLICATIONS

This application is the national phase entry of International Application No. PCT/KR2020/009650, filed on Jul. 22, 2020, designating the United States, which is based upon and claims priority to Korean Patent Applications 10-2019-0088416, filed on Jul. 22, 2019 and Korean Patent Applications 10-2020-0090939, filed on Jul. 22, 2020, the entire contents of which are incorporated herein by reference.

TECHNICAL FIELD

The present invention relates to a magnetic field shielding sheet.

BACKGROUND ART

Near field communication (NFC) and wireless charging are essentially contactless transmission methods. Such contactless transmission methods are implemented through an antenna that transmits receives a magnetic field, and a magnetic field shielding sheet disposed on one surface of the antenna so as to smoothly transmit or receive the magnetic field.

Conventionally, a sheet composed of a magnetic material such as an amorphous ribbon sheet, a ferrite sheet or a polymer sheet is used as the magnetic field shielding sheet.

Meanwhile, for the magnetic field shielding sheet, a sheet in the form of being separated and formed into multiple pieces is utilized so as to greatly reduce loss due to eddy current or improve the flexibility of the sheet itself.

For example, the magnetic field shielding sheet may be separated and fo into multiple pieces through a flake process. Such a flake process may be performed through a metal roller having a plurality of uneven or spherical halls on the outer surface and a rubber roller.

That is, when the magnetic field shielding sheet is passed through the metal roller and the rubber roller multiple times in a state in which the metal roller and the rubber roller are oppositely disposed, the magnetic field shielding sheet may be separated and formed into multiple pieces.

However, since the magnetic field shielding sheet produced through the aforementioned flake process passes between a pair of rollers, the entire area of the sheet is pressed through the pair of rollers. Accordingly, in the magnetic field shielding sheet produced through the flake process, the entire sheet is inevitably separated and formed into multiple pieces.

In addition, the magnetic field shielding sheet separated and formed into multiple pieces through a conventional flake process can obtain uniform characteristics only when the flake process is performed multiple times.

However, as the flake process is repeatedly performed, the size of the pieces separated from each other decreases, but the total number of the separated pieces increases. Accordingly, since the resistance of the shielding sheet itself increases as the flake process is repeatedly performed, the effect of the eddy current can be reduced, but the magnetic permeability of the shielding sheet falls below 1,500.

For this reason, in order to implement a magnetic field shielding sheet having a high magnetic permeability of 2,000 or more while increasing the resistance of the shielding sheet itself, there is a problem in that the overall thickness of the magnetic field shielding sheet must be increased.

SUMMARY OF THE INVENTION

The present invention is directed to providing a magnetic field shielding sheet which is capable of implementing a high magnetic permeability of 2,000 or more, while having a very thin thickness.

One aspect of the present invention provides a magnetic field shielding sheet, which is a magnetic field shielding sheet for an antenna that includes a hollow portion formed in a central region and having a predetermined area, and a pattern portion surrounding the hollow portion, including: a sheet body formed as a multi-layer sheet in which a plurality of sheets are stacked in multiple layers with adhesive layers therebetween, the sheet body is a multi-layer sheet in which the plurality of sheets having a relatively lower magnetic permeability while having a relatively higher surface resistance along a stacking direction are sequentially stacked.

In addition, the plurality of sheets may be composed of the same material as each other. For example, each of the plurality of sheets may be an amorphous ribbon sheet.

In addition, at least one sheet among the plurality of sheets may be a ferrite sheet, and at least one sheet among the remaining sheets may be an amorphous ribbon sheet.

In addition, at least one of the plurality of sheets may include a plurality of penetration portions formed inside and multiple cracks extending from the penetration portions.

For example, the plurality of penetration portions and the multiple cracks may be formed in a region corresponding to the pattern portion of the antenna.

As another example, the plurality of penetration portions and the multiple cracks may be formed in a region corresponding to the hollow portion of the antenna.

In addition, the plurality of penetration portions may be spaced apart from each other.

In addition, each of the plurality of penetration portions may be formed linearly with a width of 0.1 mm to 0.4 mm, and the plurality of penetration portions may have a total number of 4 to 16 and be formed not to be connected to each other.

In addition, each of the plurality of penetration portions may be formed linearly with a length longer than a width.

In addition, at least one of the plurality of sheets may be a sheet separated into a plurality of pieces.

In addition, at least one of the plurality of sheets may be a multi-layer sheet in which a plurality of ribbon sheets are stacked in two or more layers, and the multi-layer sheet may include a protective film attached to at least one surface of the upper surface and the lower surface via an adhesive layer.

In addition, the magnetic field shielding sheet may have a total thickness of 55 μm to 85 μm.

Meanwhile, the present invention provides a wireless power receiving module, including: an antenna for receiving wireless power; and the aforementioned magnetic field shielding sheet, which is disposed on one surface of the antenna for receiving wireless power.

In this case, the magnetic field shielding sheet may be disposed such that a sheet having a relatively high surface resistance and a low magnetic permeability is located at a position closest to the antenna for receiving wireless power.

Meanwhile, the present invention provides a portable terminal device, including the aforementioned wireless power receiving module.

According to the present invention, it is possible to achieve a high magnetic permeability of 2,000 or more, while reducing loss due to eddy current, by increasing the surface resistance of the sheet itself.

DETAILED DESCRIPTION OF THE INVENTION

Figure 1:
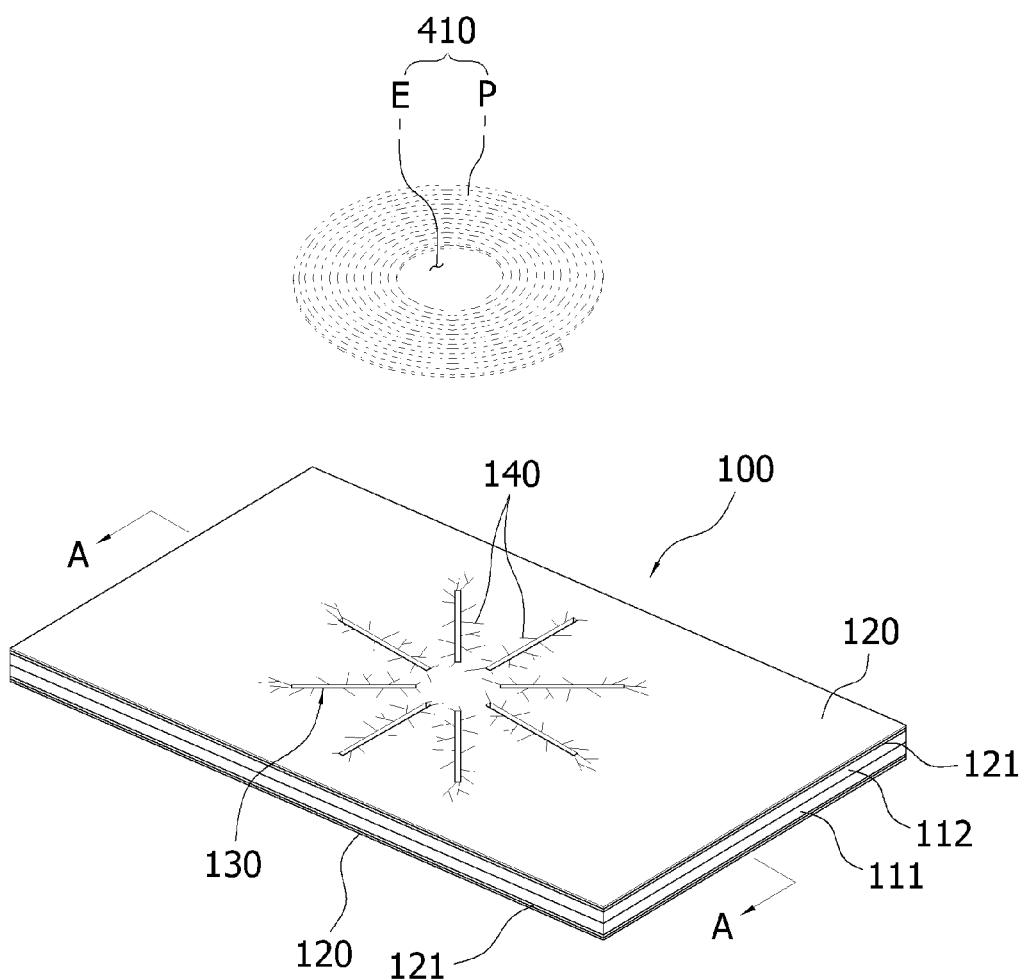
FIG. 1 is a view illustrating the magnetic field shielding sheet according to one embodiment of the present invention.

Hereinafter, exemplary embodiments of the present invention will be described in detail with reference to the accompanying drawings such that those of ordinary skill in the art may easily practice the present invention. The present invention may be implemented in various different forms, and is not limited to the exemplary embodiments described herein. In the drawings, parts that are not relevant to the description are omitted in order to clearly describe the present invention, and the same reference numerals are added to the same or similar components throughout the specification.

Magnetic field shielding sheets 100, 200, 300 according to one embodiment of the present invention include sheet bodies 110, 210, 310 as illustrated in FIGS. 1 to 7.

The sheet bodies 110, 210, 310 may be composed of a material having magnetic properties so as to shield a magnetic field generated from an antenna 410.

For example, for the sheet bodies 110, 210, 310, an amorphous ribbon sheet, a ferrite sheet, a polymer sheet or the like may be used, and the amorphous ribbon sheet may be a ribbon sheet including Fe, Si and B, a ribbon sheet including Fe, Si and Nb, or a ribbon sheet including Fe, Si, B, Cu and Nb.

Herein, the antenna 410 may include a hollow portion E having a predetermined area in a central region and a pattern portion P formed to surround the hollow portion E with a predetermined number of turns. In this case, the antenna 410 may be an antenna pattern in which the pattern portion P is patterned such that a hollow portion E having a predetermined area is formed on at least one surface of a circuit board 400 (refer to FIG. 9), or it may be a flat coil in which a conductive member having a predetermined wire diameter is wound several times such that a hollow portion E having a predetermined area is formed in the central region to form the pattern portion P.

In addition, the antenna 410 may be a wireless power transfer antenna for transmitting or receiving wireless power, an MST antenna for magnetic payment or an NFC antenna for near field communication.

Moreover, the antenna 410 may be a combo type including two or more of the above-described wireless power transfer antenna, MST antenna and NFC antenna.

In this case, the sheet body 110, 210, 310 may be a multi-layer sheet in which a plurality of sheets 111, 112, 113, 211, 212, 213 are stacked in multiple layers with adhesive layers (a) therebetween, and the plurality of sheets 111, 112, 113, 211, 212, 213 may perform different roles.

That is, the sheet bodies 110, 210, 310 may be multi-layer sheets in which a sheet for increasing surface resistance and reducing loss due to eddy current and a sheet for implementing high inductance by securing high permeability are combined.

Moreover, each of the plurality of sheets 111, 112, 113, 211, 212, 213 may be a single-layered sheet, or each of the sheets 111, 112, 113, 211, 212, 213 may be a multi-layer sheet in which a plurality of sheets are stacked in multiple layers with adhesive layers therebetween.

As a non-limiting example, at least one of the sheets 111, 112, 113, 211, 212, 213 may be a multi-layer ribbon sheet in which a plurality of amorphous ribbon sheets are stacked in multiple layers with adhesive layers therebetween.

In this case, the multi-layer ribbon sheet may be a multi-layer ribbon sheet in which a plurality of ribbon sheets are stacked in two to three layers. However, the total number of stacked layers of the multi-layer ribbon sheet is not limited thereto, and the total number of stacked layers may be appropriately changed according to design conditions.

In addition, at least one of the sheets 111, 112, 113, 211, 212 and 213 may be an amorphous ribbon sheet, and at least one of the remaining sheets may be a ferrite sheet.

That is, the sheet bodies 110, 210, 310 may be multi-layer sheets in which at least one amorphous ribbon sheet layer and at least one ferrite sheet layer are stacked in multiple layers with adhesive layers therebetween.

In this case, the plurality of sheets 111, 112, 113, 211, 212, 213 may be composed of different materials, or may be composed of the same material as each other.

That is, as described above, in the plurality of sheets 111, 112, 113, 211, 212, 213, at least one sheet may be an amorphous ribbon sheet and at least one of the remaining sheets may be a ferrite sheet, or in the plurality of sheets 111, 112, 113, 211, 212, 213, all sheets may be amorphous ribbon sheets or ferrite sheets.

For example, in the sheet bodies 110, 210, 310, the sheet which serves to reduce loss due to eddy current by increasing the surface resistance, and the sheet for implementing high inductance by securing high magnetic permeability may be composed of the same material as each other.

Through this, the plurality of sheets 111, 112, 113, 211, 212, 213 constituting the sheet bodies 110, 210, 310 may be composed of the same material as each other, and at least one of surface resistance and magnetic permeability may be configured to have different values.

As a non-limiting example, the sheet bodies 110, 210, 310 may be multi-layer sheets in which a plurality of sheets 111, 112, 113, 211, 212, 213, which are composed of the same material and have different characteristics, are stacked in multiple layers. In addition, in the sheet bodies 110, 210, 310, a plurality of sheets 111, 112, 113, 211, 212, 213 may be sequentially stacked in a manner in which at least one characteristic increases or decreases along the stacking direction.

Specifically, the sheet bodies 110, 210, 310 may be multi-layer sheets in which a plurality of sheets 111, 112, 113, 211, 212, 213, which have a relatively high surface resistance and a relatively low magnetic permeability, are sequentially stacked. In this case, the sheet bodies 110, 210, 310 may have a lower magnetic permeability while the surface resistance increases from a lower layer to an upper layer.

Through this, the magnetic field shielding sheets 100, 200, 300 according to one embodiment of the present invention may reduce loss due to eddy current through a sheet having a relatively high surface resistance among the plurality of sheets 111, 112, 113, 211, 212, 213, and may implement high inductance through a sheet having a relatively high permeability among the plurality of sheets 111, 112, 113, 211, 212, 213. In this case, at least one sheet having a relatively high magnetic permeability among the plurality of sheets 111, 112, 113, 211, 212, 213 may have a magnetic permeability of 2,000 or more.

Accordingly, the magnetic field shielding sheets 100, 200, 300 according to one embodiment of the present invention may achieve both of a function of implementing high inductance through a sheet portion having a relatively high magnetic permeability, and a function of reducing loss due to eddy current through a sheet portion having a relatively high surface resistance, even if a plurality of sheets 111, 112, 113, 211, 212, 213 are composed of the same material.

As a result, the magnetic field shielding sheets 100, 200, 300 according to one embodiment of the present invention may implement both of the reduction of loss due to eddy current through high surface resistance, and high inductance through high magnetic permeability while maintaining a very thin thickness, even if a plurality of sheets 111, 112, 113, 211, 212, 213 are composed of the same material.

For example, the magnetic field shielding sheets 100, 200, 300 according to one embodiment of the present invention may implement both of the reduction of loss due to eddy current through high surface resistance, and high inductance through high magnetic permeability, while having a very thin thickness with a total thickness of 55 µm to 85 µm.

In this case, in the magnetic field shielding sheets 100, 200, 300 according to one embodiment of the present invention, the surface resistance and magnetic permeability of each of the sheets 111, 112, 113, 211, 212, 213 constituting the sheet bodies 110, 210, 310 may be controlled through a penetration portion 130 and the presence or absence of separation formation.

That is, as the total number and total formation area of penetration portions 130 and cracks 140 formed in the sheets 112, 212, 213 increase, the magnetic permeability decreases, whereas the surface resistance may increase.

In addition, the sheet 113 (refer to FIG. 8D) which is separated and formed into multiple pieces may have a relatively high surface resistance, while having a relatively lower magnetic permeability than the sheets 112, 212, 213 including the penetration portions 130 and the cracks 140.

Moreover, the sheet 111, 211, in which the sheet itself is not separated and formed into multiple pieces and the penetration portions 130 and the cracks 140 are not also formed, may have a low surface resistance, while having a relatively lower magnetic permeability than the above-described sheets 112, 212, 213.

Figure 8A:
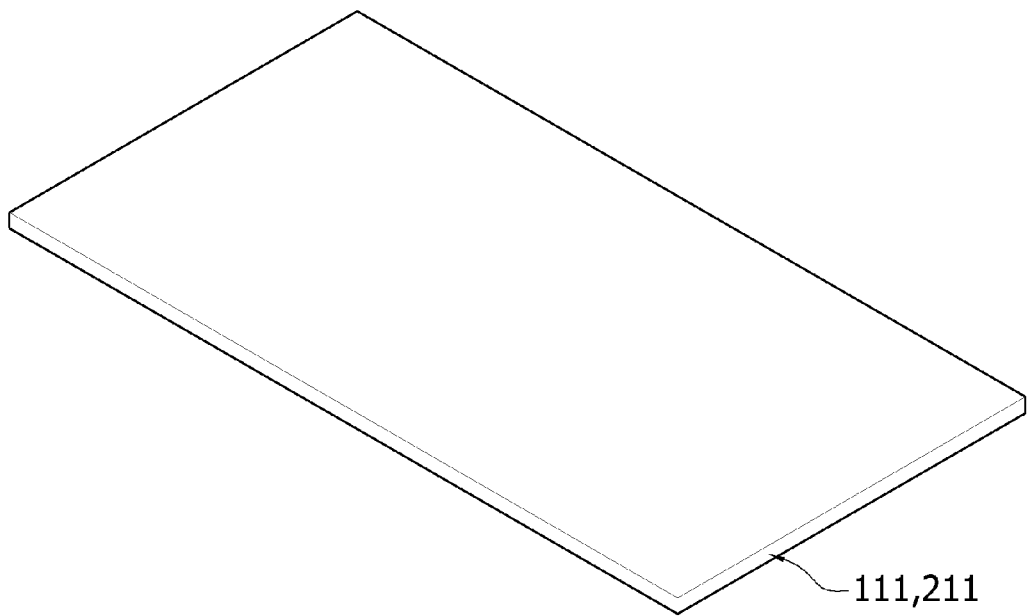
FIGS. 8A to 8D are views showing various sheets that can be applied to the magnetic field shielding sheet according to an embodiment of the present invention.
Figure 8B:
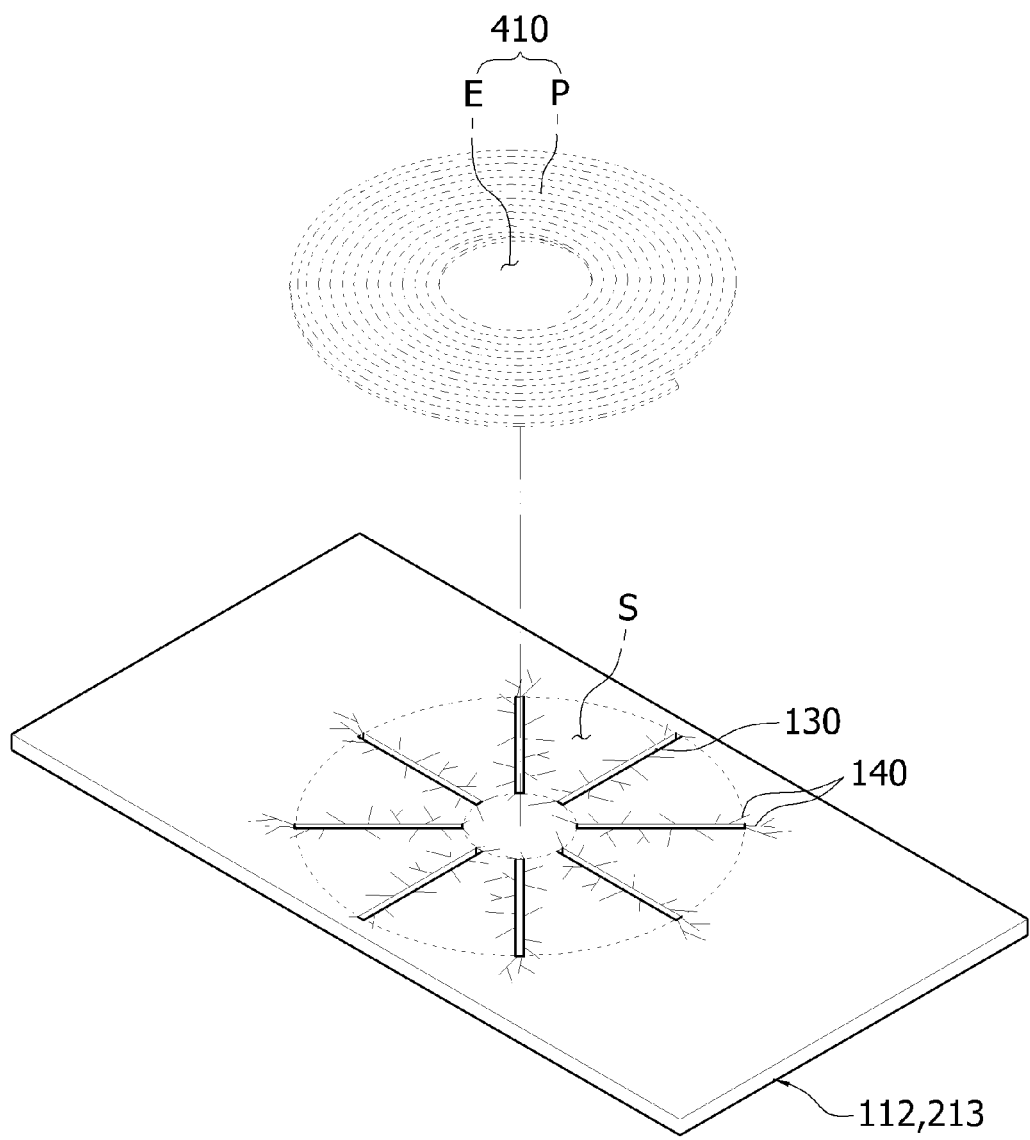
Figure 8C:
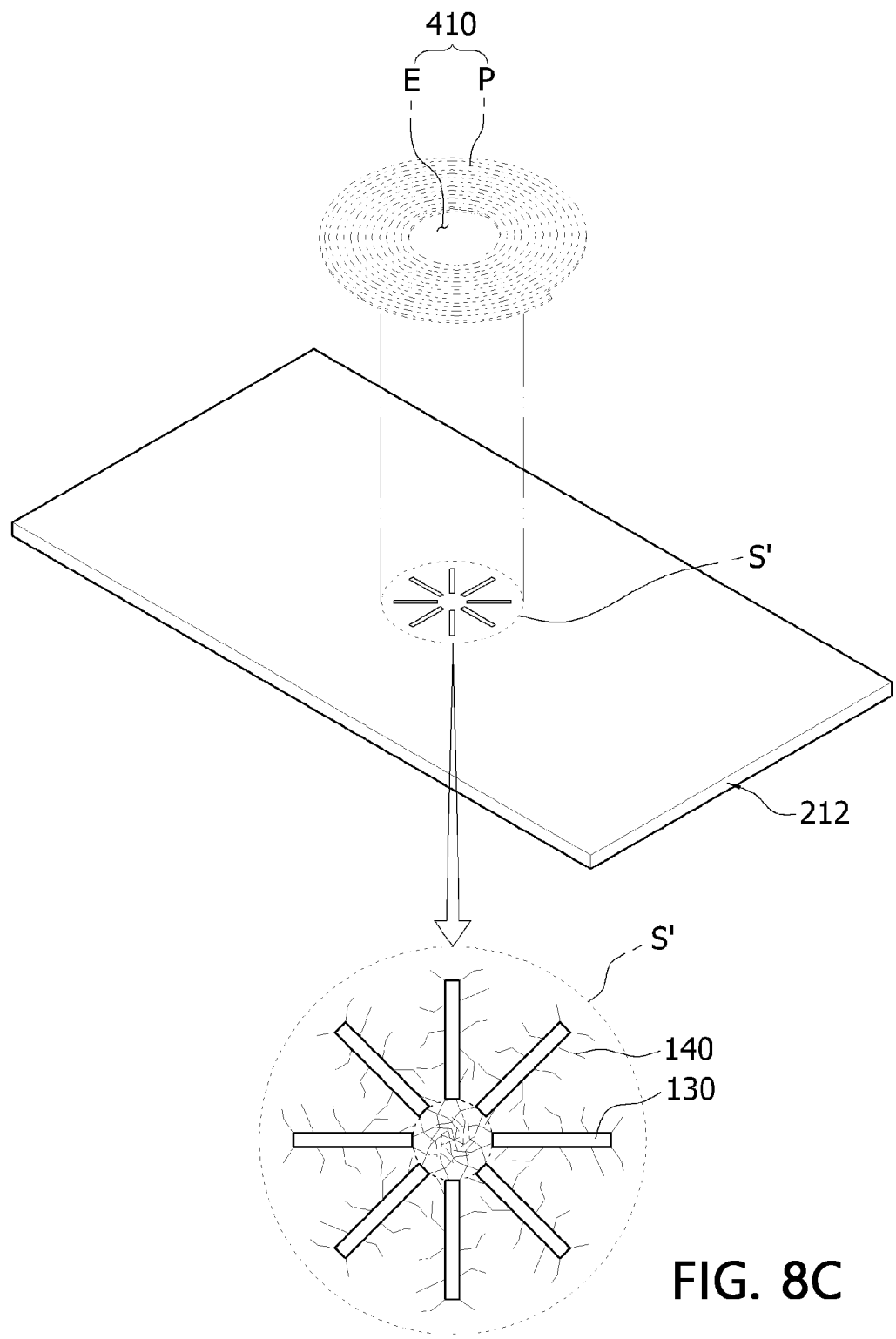
Figure 8D:
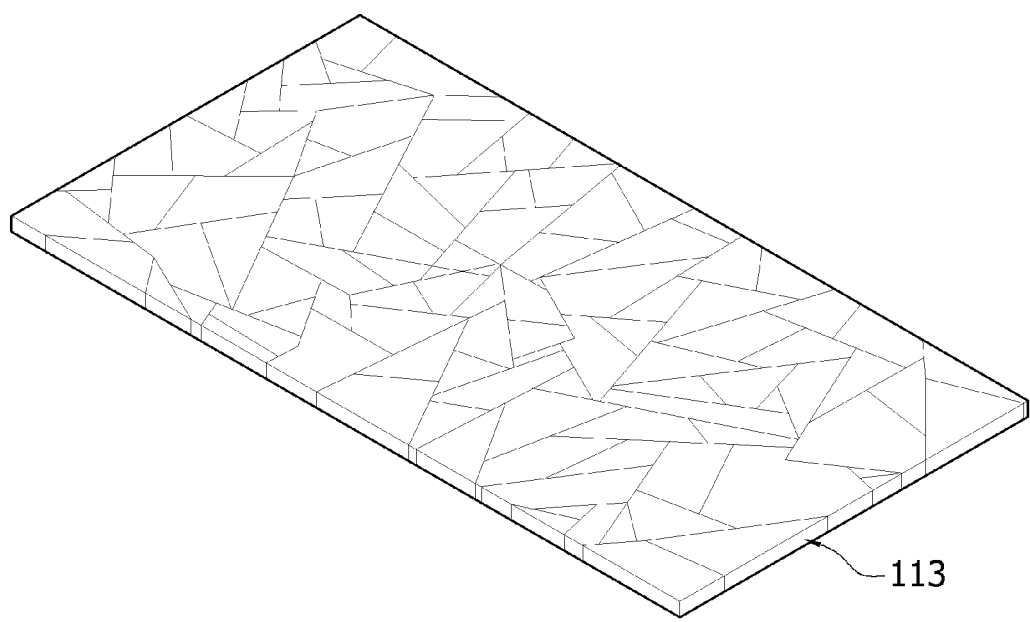

For example, as illustrated in FIG. 8A, each of the sheets 111, 112, 113, 211, 212, 213 constituting the sheet bodies 110, 210, 310 may be sheets 111, 211 which are formed as single body, or as illustrated in FIGS. 8B and 8C, it may be sheets 112, 212, 213 in which a plurality of penetration portions 130 are formed in the inside region, or as illustrated in FIG. 8D, it may be a sheet 113 which is separated and formed into multiple pieces.

In this case, the sheets 112, 212, 213 on which the plurality of penetration portions 130 are formed may include multiple cracks 140 extending from the penetration portion 130 as illustrated in FIGS. 8B and 8C, and the plurality of penetration portions 130 and multiple cracks 140 may be formed locally on a partial area of the total area of the sheets 112, 212, 213.

In addition, the sheets 112, 212, 213 on which the plurality of penetration portions 130 are formed may be formed of a material including a metal component such that the multiple cracks 140 may be formed together with the penetration portions 130.

For example, the penetration portion 130 may be formed to penetrate the sheets 112, 212, 213, and the multiple cracks 140 may be formed to extend from the penetration portion 130. In addition, the multiple cracks 140 formed from the penetration portion 130 may or may not be connected to each other, and some of the multiple cracks 140 may be connected to each other and the others may not be connected to each other. In addition, the multiple cracks 140 may be formed by being induced from the penetration portion 130 through an external force applied to the sheets 112, 212, 213 in the process of forming the penetration portion 130.

Accordingly, in the magnetic field shielding sheets 100, 200, 300 according to one embodiment of the present invention, the influence by eddy current may be reduced, because the overall resistance may be increased through the sheets 112, 212, 213 on which the penetration portions 130 and multiple cracks 140 are formed.

That is, the sheets 112, 212, 213 on which the penetration portion 130 and the plurality of cracks 140 are formed may function as an eddy current reducing means, which is capable of reducing eddy current.

Herein, the penetration portion 130 may be formed to have a predetermined width and length, and it may be formed in an appropriate number of one or more. In addition, the penetration portion 130 may be formed to have a length longer than a width. In addition, the total number of the multiple cracks 140 may be relatively greater than the total number of the penetration portions 130.

As a non-limiting example, the penetration portion 130 may be formed linearly with a length longer than a width.

In this case, the penetration portion 130 may be a linear penetration portion formed in a direction perpendicular to the width direction or length direction of the sheets 112, 212,213, or a direction parallel to the width direction or the length direction of the sheets 112,212,213. Further, the penetration portion 130 may be a linear penetration portion formed to be inclined at a certain angle with respect to the width direction or the length direction of the sheets 112, 212, 213, or may be a penetration portion formed in an arc shape having a predetermined curvature.

In this case, when at least some of the sheets 112, 212, 213 of the plurality of sheets 111, 112, 113, 211, 212, 213 constituting the sheet bodies 110, 210, 310 include the above-described penetration portion 130 and cracks 140, the penetration portion 130 and multiple cracks 140 may be formed locally on a partial area of the total area of the sheets 112, 212, 213.

That is, the penetration portion 130 and cracks 140 may be formed locally on a partial area of the total area of the sheets 112, 212, 213 in consideration of an arrangement relationship with the antenna 410 that transmits or receives wireless power.

For example, as illustrated in FIG. 8B, the penetration portion 130 and cracks 140 may be formed in a corresponding area S in which the pattern portion P of the antenna 410 is disposed among the total area of the sheets 112, 213. In this case, the penetration portion 130 may further include a portion extending from the corresponding area S toward the hollow portion E of the antenna 410 in addition to the corresponding area S.

As another example, as illustrated in FIG. 8C, the penetration portion 130 and cracks 140 may be formed only in a partial area in which the magnetic flux is concentrated among the total area of the sheet 212, and a partial area in which the magnetic flux is concentrated may be a corresponding area S' in which the hollow portion E formed in the central region of the antenna 410 is disposed.

Specifically, as illustrated in FIG. 8B, when the antenna 410 is disposed on one surface of the sheet 112, 213, the penetration portion 130 and multiple cracks 140 extending from the penetration portion 130 may be formed in a corresponding area S in which the pattern portion P of the antenna 410 is disposed among the total area of the sheet 112, 213.

In this case, a plurality of penetration portions 130 may be formed in the corresponding area S, and the plurality of penetration portions 130 formed in the corresponding area S may be spaced apart from each other, and the multiple cracks 140 may be extended and formed from each of the plurality of penetration portions 130.

In this case, the plurality of penetration portions 130 may be formed radially with respect to the center point of the hollow portion E of the antenna 410, and the plurality of penetration portions 130 may be formed so as not to be connected to each other.

In this embodiment, the width of the penetration portions 130 may be 0.1 mm to 0.4 mm, and the total number of the penetration portions 130 formed in the sheets 112, 213 may be 4 to 16.

In this case, if the width of the penetration portions 130 is more than 0.4 mm, the amount of the magnetic field leaked through the penetration portions 130 formed in the sheets 112, 213 may increase, thereby deteriorating the performance of the shielding sheet.

On the other hand, if the width of the penetration portion 130 is less than 0.1 mm, the process of forming the penetration portions 130 in the sheets 112, 213 is difficult, and productivity may be lowered.

In addition, compared to when the total number of the penetration portions 130 formed in the sheets 112, 213 is 4 to 16 or less, when the total number of the penetration portions 130 formed in the sheets 112, 213 is 17 or more, the resistance of the sheet itself increases as the total number of the penetration portions increases, but the additional eddy current reducing effect is insignificant, and there is a problem in that it is difficult to implement a high magnetic permeability of 2,000 or more.

On the other hand, compared to when the total number of the penetration portions 130 formed in the sheets 112, 213 is 4 to 16 or less, when the total number of the penetration portions 130 formed in the sheets 112, 213 is less than 4, it is advantageous to implement a high magnetic permeability of 2,000 or more, but since the resistance of the sheet itself is not sufficient, characteristic deterioration due to eddy current loss may occur.

Alternatively, as illustrated in FIG. 8C, when the antenna 410 is disposed on one surface of the sheet 212, the penetration portion 130 and multiple cracks 140 extending from the penetration portion 130 may be formed in a corresponding area S' corresponding to the hollow portion E of the antenna 410 among the total area of the sheet 212.

In this case, a plurality of penetration portions 130 may be formed in the corresponding area S', and the plurality of penetration portions 130 formed in the corresponding area S' may be spaced apart from each other, and the multiple cracks 140 may be extended and formed from the plurality of penetration portions 130, respectively.

In addition, the plurality of penetration portions 130 may be formed radially with respect to a center point of the corresponding area S'.

In this embodiment, the width of the penetration portion 130 may be 0.1 mm to 0.4 mm.

In this case, if the width of the penetration portion 130 is more than 0.4 mm, the amount of the magnetic field leaked through the penetration portions 130 formed in the sheet 212 may increase, thereby deteriorating the performance of the shielding sheet.

On the other hand, if the width of the penetration portion 130 is less than 0.1 mm, the process of forming the penetration portions 130 in the sheet 212 is difficult, and productivity may be lowered.

However, in the present invention, the arrangement of the penetration portions 130 formed in the sheets 112, 212 213 is not limited thereto, and the penetration portions 130 may be formed in various ways. For example, the plurality of penetration portions 130 may be formed locally at random positions of the sheets 112, 212, 213 regardless of the arrangement position of the antenna 410, or some of the plurality of penetration portions 130 may be formed to be connected to each other.

Meanwhile, as described above, in the sheets 112, 212, 213 including the plurality of penetration portions 130 and cracks 140, as the total number and total formation area of the plurality of penetration portions 130 and the multiple cracks 140 increase, the permeability decreases, whereas the surface resistance may increase.

In addition, the sheet 113 in which the sheet itself is separated and formed into multiple pieces may have a relatively lower magnetic permeability and a relatively higher surface resistance than the sheets 112, 212, 213 in which the penetration portion 130 and cracks 140 are formed.

In the present invention, by constituting the sheet bodies 110, 210, 310 using the characteristics of the above-described sheets, it is possible to implement the magnetic field shielding sheets 100, 200, 300 having high inductance by using high magnetic permeability, while reducing loss due to eddy current using a high surface resistance.

That is, in the present invention, various sheets 111, 112, 113, 211, 212, 213 illustrated in FIGS. 8A to 8D may be combined with each other to constitute the sheet bodies 110, 210, 310 illustrated in FIGS. 1 to 7.

Accordingly, the magnetic field shielding sheets 100, 200, 300 according to one embodiment of the present invention may have a high magnetic permeability while having a high surface resistance, even if each of the sheets 111, 112, 113, 211, 212, 213 constituting the sheet bodies 110, 210, 310 is composed of the same material.

Figure 2:
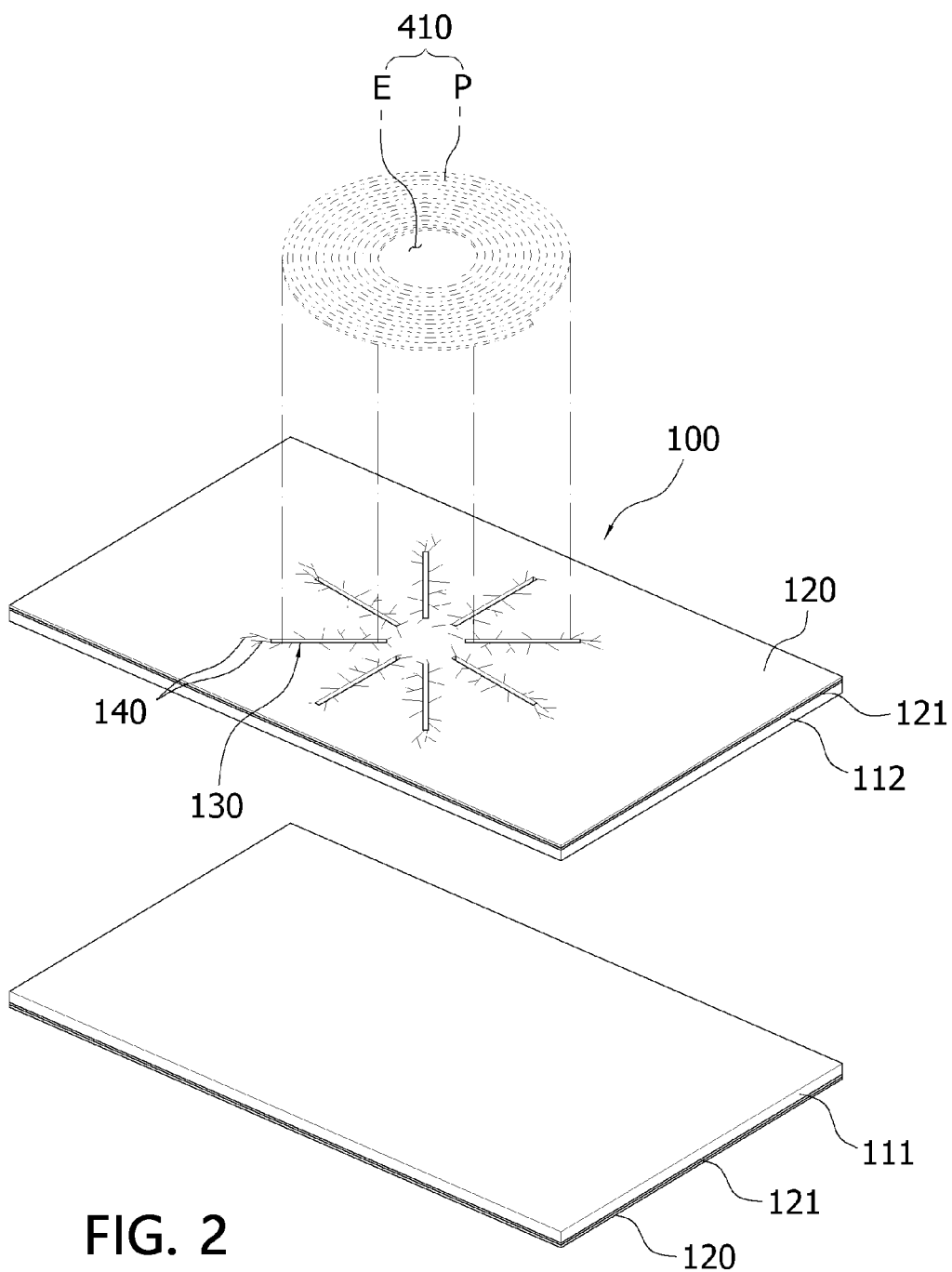
FIG. 2 is a view in which a plurality of sheets are forcibly separated from FIG. 1.
Figure 3:
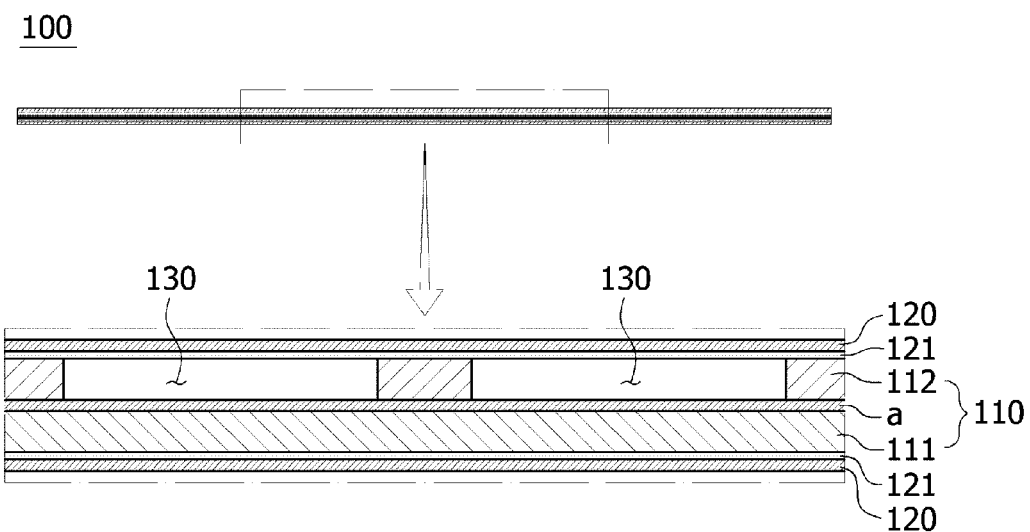
FIG. 3 is a cross-sectional view in the direction A-A of FIG. 1.

As a specific example, as illustrated in FIGS. 1 to 3, the magnetic field shielding sheet 100 according to one embodiment of the present invention may include a first sheet 111 and a second sheet 112, and each of the first sheet 111 and the second sheet 112 may be an amorphous ribbon sheet.

Herein, the first sheet 111 may be a sheet that is not separated into multiple pieces without forming the penetration portions 130 and multiple cracks 140 described above, and the second sheet 112 may be a sheet in which a plurality of penetration portions 130 and multiple cracks 140 are formed in a region corresponding to the pattern portion P of the antenna 410.

Moreover, each of the first sheet 111 and the second sheet 112 may be a multi-layer ribbon sheet in which a plurality of amorphous ribbon sheets are stacked in multiple layers.

Through this, the first sheet 111 may have a high magnetic permeability while having a low surface resistance, and the second sheet 112 may have a relatively lower magnetic permeability than the first sheet 111 while having a higher surface resistance.

As a result, the magnetic field shielding sheet 100 according to one embodiment of the present invention may reduce loss due to eddy current through the second sheet 112, while implementing high magnetic permeability through the first sheet 111.

However, the magnetic field shielding sheet 100 according to one embodiment of the present invention is not limited thereto, and each of the first sheet 111 and the second sheet 112 may be appropriately replaced with any of the sheets illustrated in FIGS. 8A to 8D, as long as it has an increased surface resistance while the magnetic permeability decreases relatively along the stacking direction.

For example, in the magnetic field shielding sheets 200, 300 according to one embodiment of the present invention, the sheet bodies 210, 310 may be implemented as multi-layer sheets of three or more layers in which the sheets illustrated in FIGS. 8A to 8D are combined with each other.

Specifically, in the magnetic field shielding sheets 200, 300 according to one embodiment of the present invention, as illustrated in FIGS. 4 to 7, the sheet bodies 210, 310 may be multi-layer sheets including first sheets 111, 211, second sheets 112, 212, and third sheets 113, 213.

Figure 4:
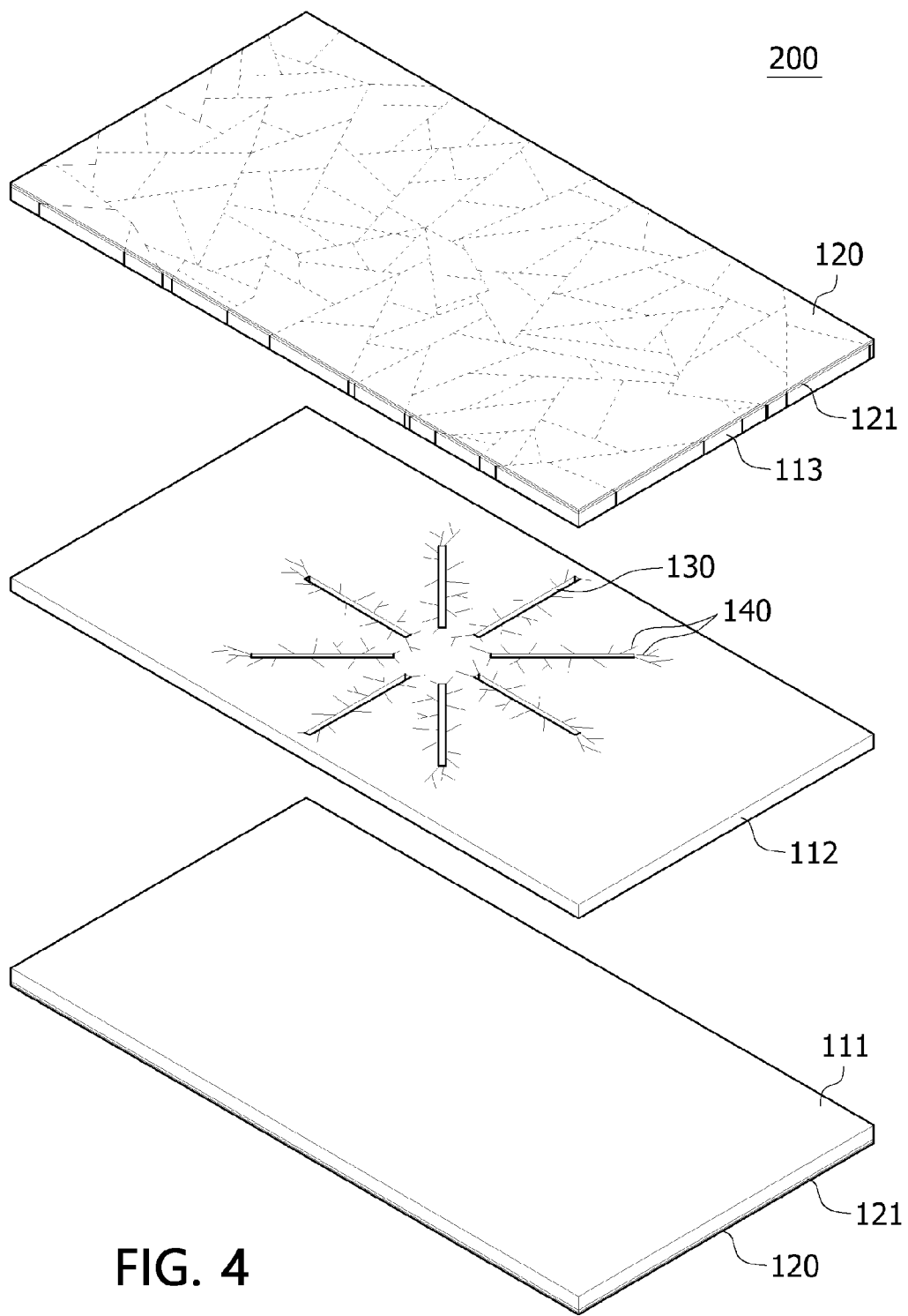
FIG. 4 is a diagram forcibly separating a plurality of sheets from the magnetic field shielding sheet according to another embodiment of the present invention.
Figure 5:
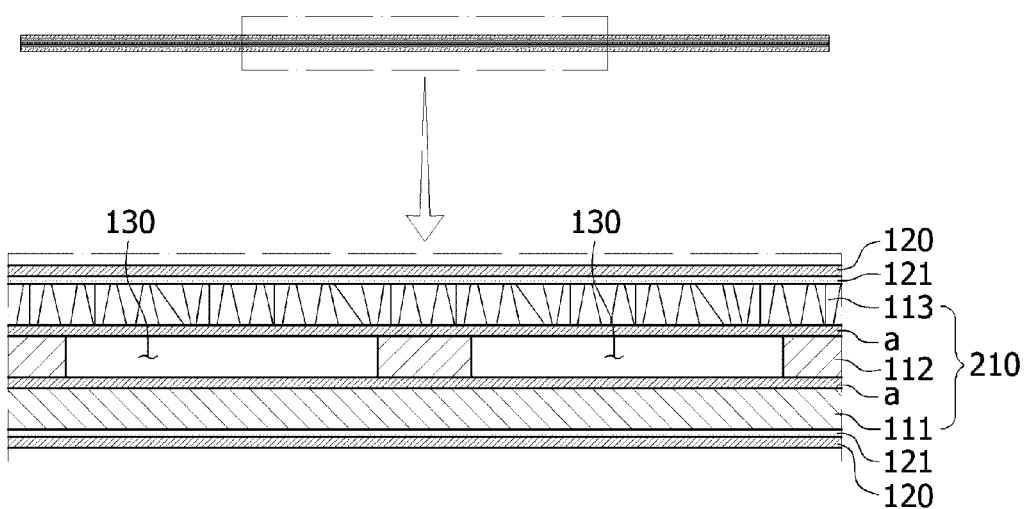
FIG. 5 is a cross-sectional view of the coupling of FIG. 4.

In this case, as illustrated in FIGS. 4 and 5, the first sheet 111 may be the sheet of FIG. 8A that is not separated into multiple pieces without forming the penetration portion 130 and multiple cracks 140 described above, and the second sheet 112 may be the sheet of FIG. 8B in which a plurality of penetration portions 130 and multiple cracks 140 are formed in a region corresponding to the pattern portion P of the antenna 410, and the third sheet 113 may be the sheet of FIG. 8D which is separated into multiple pieces.

Figure 6:
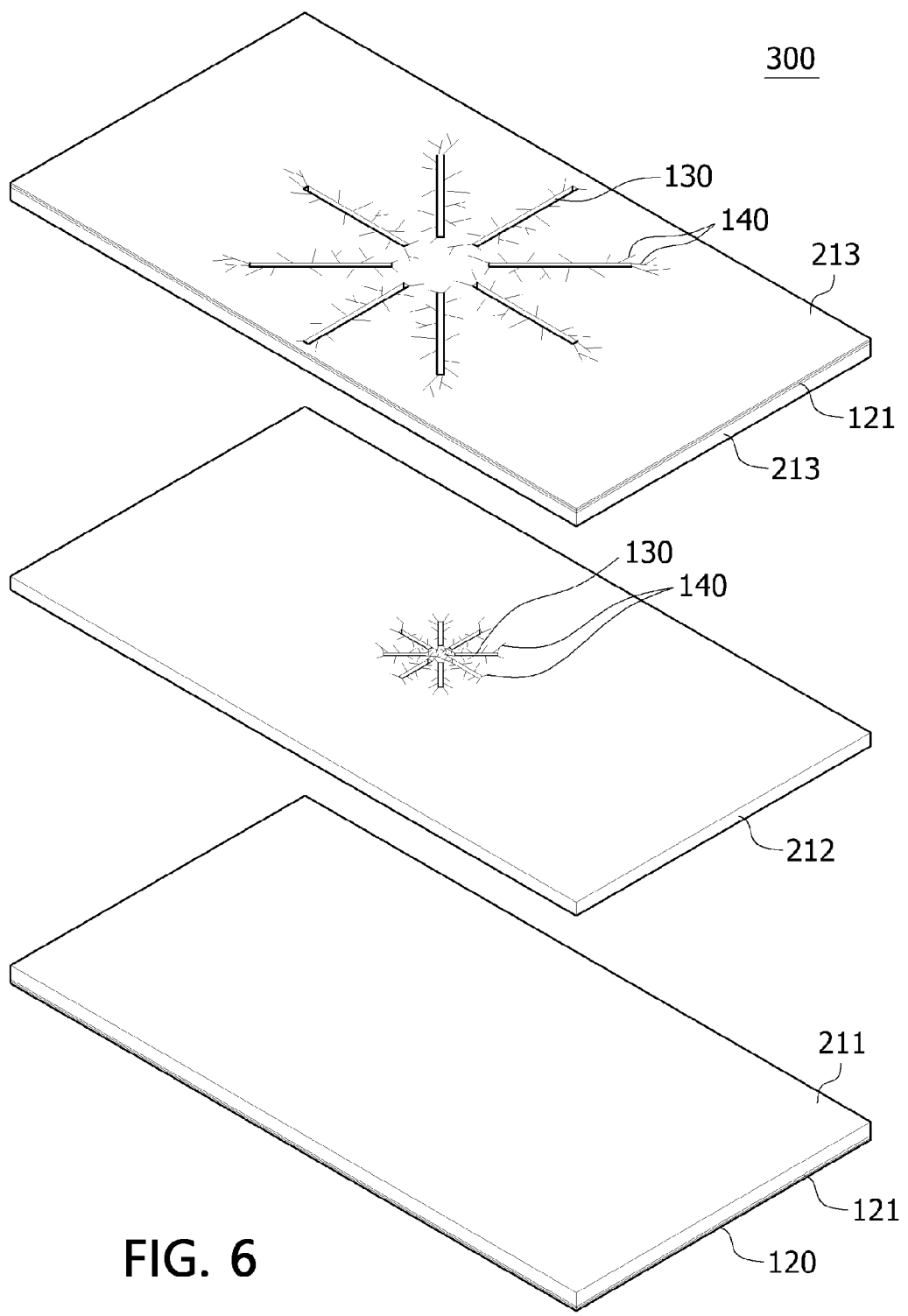
FIG. 6 is a diagram forcibly separating a plurality of sheets from the magnetic field shielding sheet according to still another embodiment of the present invention.
Figure 7:
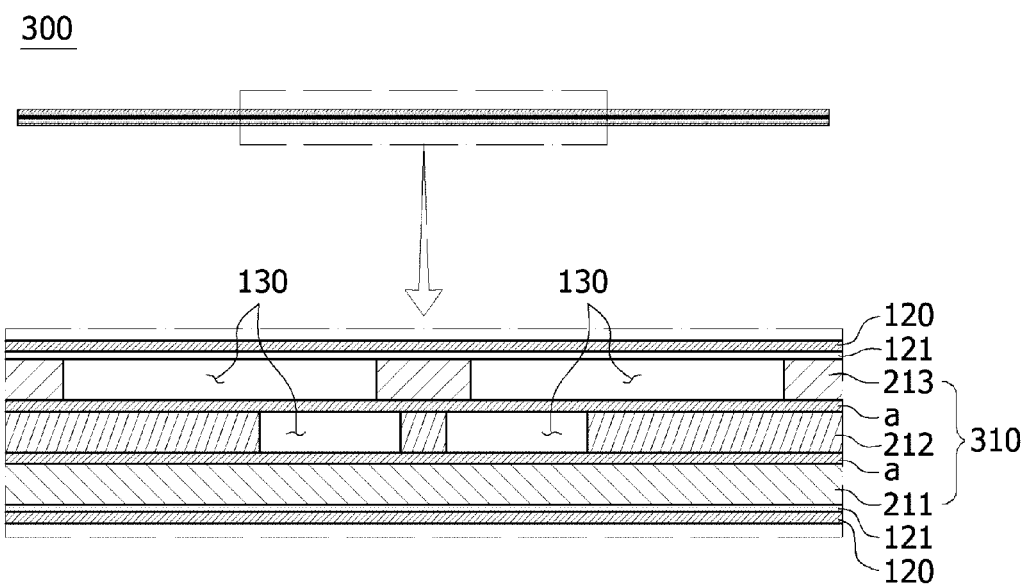
FIG. 7 is a cross-sectional view of the coupling of FIG. 6.

Alternatively, as illustrated in FIGS. 6 and 7, the first sheet 211 may be the sheet of FIG. 8A that is not separated into multiple pieces without forming the penetration portions 130 and multiple cracks 140 described above, and the second sheet 212 may be the sheet of FIG. 8C in which a plurality of penetration portions 130 and multiple cracks 140 are formed in a region corresponding to the hollow portion E of the antenna 410, and the third sheet 213 may be the sheet of FIG. 8D in which a plurality of penetration portions 130 and multiple cracks 140 are formed in a region corresponding to the pattern portion P of the antenna 410.

Meanwhile, the magnetic field shielding sheets 100, 200, 300 according to one embodiment of the present invention may include a protective film 120 attached to at least one of the upper and lower surfaces of the sheet bodies 110, 210, 310 via an adhesive layer 121.

Accordingly, even if each of the sheets 111, 112, 113, 211, 212, 213 constituting the sheet bodies 110, 210, 310 is formed separately into multiple pieces or includes the penetration portions 130 and multiple cracks 140 formed inside the sheet, the sheet bodies 110, 210, 310 may maintain a plate shape through the protective film 120.

The magnetic field shielding sheets 100, 200, 300 according to one embodiment of the present invention described above may be implemented as a wireless power receiving module 1000 for wireless power transfer.

Figure 9:
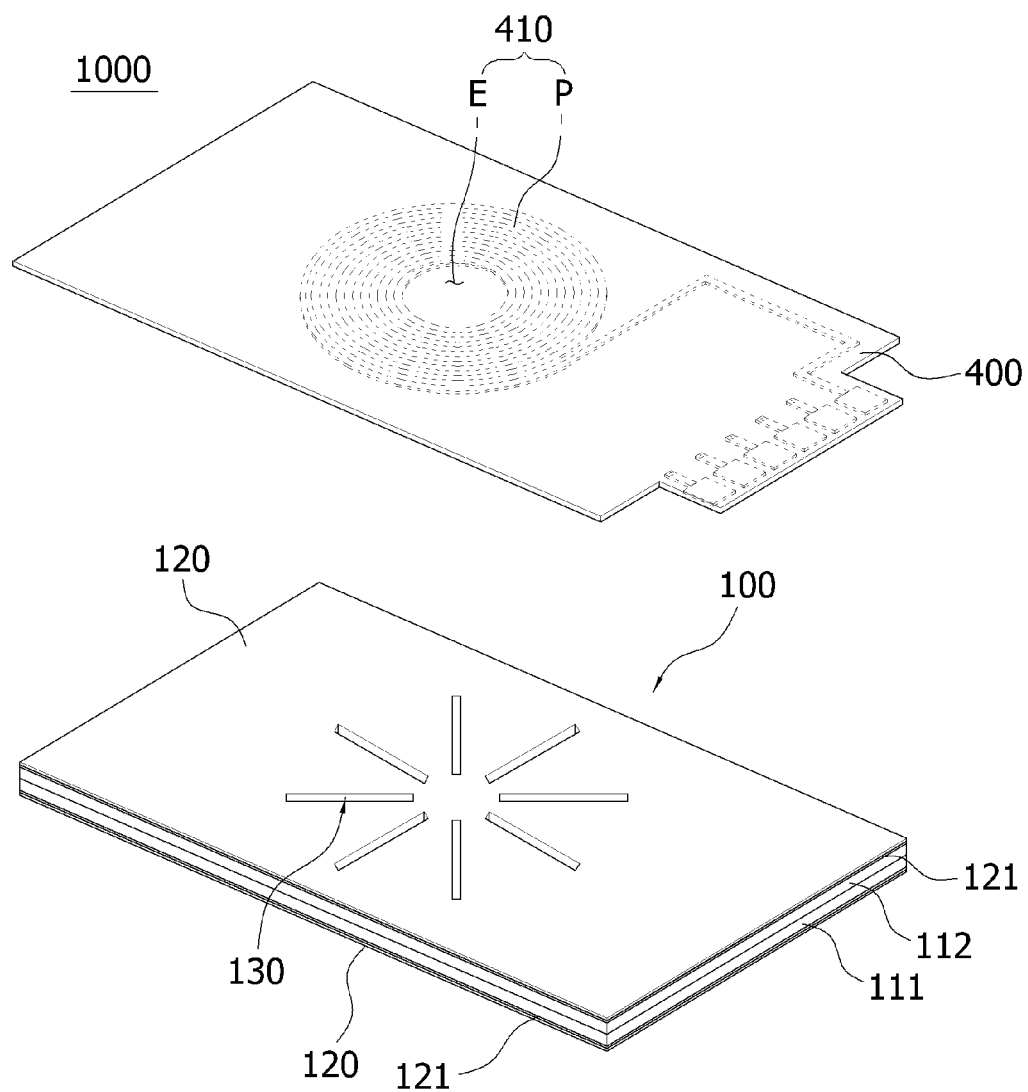
FIG. 9 is a view showing a wireless power receiving module to which the magnetic field shielding sheet according to an embodiment of the present invention is applied.

That is, as illustrated in FIG. 9, the wireless power receiving module 1000 may include an antenna for receiving wireless power 410 for wirelessly receiving power, and a magnetic field shielding sheet 100 which is disposed on one surface of the antenna for receiving wireless power 410 to shield a magnetic field and focus a magnetic field in a required direction.

Herein, the antenna for receiving wireless power 410 may be an antenna pattern in which a pattern portion P is patterned on at least one surface of the circuit board 400 such that a hollow portion E having a predetermined area is formed in the central region, or it may be a flat coil in which a conductive member having a predetermined wire diameter is wound multiple times.

In addition, the magnetic field shielding sheet 100 constituting the wireless power receiving module 1000 may be the magnetic field shielding sheet 100 described above. In the drawings, the form illustrated in FIGS. 1 to 3 is exemplified as the magnetic field shielding sheet 100, but the present invention is not limited thereto, and the magnetic field shielding sheets 200, 300 illustrated in FIGS. 4 to 7 may also be applied in the same manner.

As such, the wireless power receiving module 1000 may include only the antenna for receiving wireless power 410, or may further include various antennas performing different functions.

For example, the wireless power receiving module 1000 may further include at least one of an MST antenna for magnetic payment and an NFC antenna for near field communication, in addition to the antenna for receiving wireless power 410.

Moreover, in the wireless power receiving module 1000, the magnetic field shielding sheets 100, 200, 300 may be disposed such that among the plurality of sheets constituting the sheet bodies 110, 210, 310, a sheet having a relatively high surface resistance and a low magnetic permeability is located at a position closest to the antenna for receiving wireless power 410.

That is, as illustrated in FIG. 9, the magnetic field shielding sheet 100 includes a first sheet 111 and a second sheet 112 stacked on the first sheet 111, and when the antenna for receiving wireless power 410 is disposed on one surface of the second sheet 112, the second sheet 112 may be a sheet having a relatively larger surface resistance than the first sheet 111, while having a low magnetic permeability.

As such, the wireless power receiving module 1000 may be applied to a portable terminal device such as a mobile phone, a tablet PC or the like.

Although an exemplary embodiment of the present invention has been described above, the spirit of the present invention is not limited to the exemplary embodiment presented in the present specification, and those skilled in the art who understand the spirit of the present invention will be able to easily suggest other exemplary embodiments by modifying, changing, deleting or adding components within the scope of the same spirit, but this is also said to be within the scope of the present invention.

The invention claimed is:

1. A magnetic field shielding sheet, which is a magnetic field shielding sheet for an antenna that includes a hollow portion formed in a central region and having a predetermined area, and a pattern portion surrounding the hollow portion, the magnetic field shielding sheet comprising:

a sheet body formed as a multi-layer sheet in which a plurality of sheets are stacked in multiple layers with adhesive layers therebetween, wherein the sheet body is a multi-layer sheet in which the plurality of sheets having a relatively lower magnetic permeability while having a relatively higher surface resistance along a stacking direction are sequentially stacked, wherein at least one sheet of the plurality of sheets is a sheet including a plurality of penetration portions and multiple cracks extending from the penetration portions, and wherein the plurality of penetration portions and multiple cracks are formed locally on a partial area of a total area of the sheet so that the total area of the sheet is not separated into multiple pieces.

2. The magnetic field shielding sheet of claim 1, wherein the plurality of sheets are composed of the same material as each other.

3. The magnetic field shielding sheet of claim 1, wherein at least one sheet among the plurality of sheets is a ferrite sheet, and at least one sheet among the remaining sheets is an amorphous ribbon sheet.

4. The magnetic field shielding sheet of claim 1, wherein each of the plurality of sheets is an amorphous ribbon sheet.

5. The magnetic field shielding sheet of claim 1, wherein the plurality of penetration portions and the multiple cracks are formed in a region corresponding to the pattern portion of the antenna.

6. The magnetic field shielding sheet of claim 1, wherein the plurality of penetration portions and the multiple cracks are formed in a region corresponding to the hollow portion of the antenna.

7. The magnetic field shielding sheet of claim 1, wherein the plurality of penetration portions are spaced apart from each other.

8. The magnetic field shielding sheet of claim 1, wherein each of the plurality of penetration portions is formed linearly with a width of 0.1 mm to 0.4 mm, and wherein the plurality of penetration portions have a total number of 4 to 16 and are formed not to be connected to each other.

9. The magnetic field shielding sheet of claim 1, wherein each of the plurality of penetration portions is formed linearly with a length longer than a width.

10. The magnetic field shielding sheet of claim 1, wherein at least one of the plurality of sheets is a sheet separated into a plurality of pieces.

11. The magnetic field shielding sheet of claim 1, wherein at least one of the plurality of sheets is a multi-layer sheet in which a plurality of ribbon sheets are stacked in two or more layers, and the multi-layer sheet includes a protective film attached to at least one surface of the upper surface and the lower surface via an adhesive layer.

12. The magnetic field shielding sheet of claim 1, wherein the magnetic field shielding sheet has a total thickness of 55 µm to 85 µm.

13. A wireless power receiving module, comprising:
an antenna for receiving wireless power; and
the magnetic field shielding sheet according to claim 1, which is disposed on one surface of the antenna for receiving wireless power.

14. The wireless power receiving module of claim 13, wherein the magnetic field shielding sheet is disposed such that a sheet having a relatively high surface resistance and a low magnetic permeability is located at a position closest to the antenna for receiving wireless power.

15. A portable terminal device, comprising the wireless power receiving module of claim 13.

* * * * *